(12) United States Patent
Terui et al.

(10) Patent No.: US 9,613,893 B2
(45) Date of Patent: Apr. 4, 2017

(54) WIRING SUBSTRATE AND METHOD FOR MANUFACTURING THE SAME

(71) Applicant: IBIDEN CO., LTD., Ogaki (JP)

(72) Inventors: Makoto Terui, Ogaki (JP); Ryojiro Tominaga, Ogaki (JP); Masatoshi Kunieda, Ogaki (JP); Noriki Sawada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/799,846

(22) Filed: Jul. 15, 2015

(65) Prior Publication Data

US 2016/0020164 A1    Jan. 21, 2016

(30) Foreign Application Priority Data

Jul. 15, 2014   (JP) ................................ 2014-144674

(51) Int. Cl.
*H05K 1/16* (2006.01)
*H01L 23/498* (2006.01)
(Continued)

(52) U.S. Cl.
CPC .... *H01L 23/49822* (2013.01); *C23C 18/1651* (2013.01); *C23C 18/1653* (2013.01); *C23C 18/31* (2013.01); *C23C 18/32* (2013.01); *C23C 18/42* (2013.01); *C25D 7/00* (2013.01); *H01L 21/486* (2013.01); *H01L 21/4857* (2013.01); *H01L 23/49827* (2013.01); *H01L 23/5389* (2013.01); *H05K 3/4007* (2013.01);
(Continued)

(58) Field of Classification Search
CPC ............ H01L 23/49822; H05K 3/4694; H05K 2201/10378; H05K 3/4644; H05K 1/185
See application file for complete search history.

(56) References Cited

U.S. PATENT DOCUMENTS 6,445,069 B1 * 9/2002 Ling .................... H01L 21/288
257/738
2005/0104207 A1 * 5/2005 Dean ...................... H01L 24/05
257/734

(Continued)

FOREIGN PATENT DOCUMENTS

JP       2007-129545 A1   11/2007

*Primary Examiner* — Steven T Sawyer
(74) *Attorney, Agent, or Firm* — Oblon, McClelland, Maier & Neustadt, L.L.P.

(57) ABSTRACT

A wiring substrate includes a first outermost conductor layer, a first outermost insulating layer covering the first conductor layer, a second outermost conductor layer formed on opposite side of the first conductor layer, and a second outermost insulating layer covering the second conductor layer. The first insulating layer has first openings such that the first openings are exposing first conductor pads including portions of the first conductor layer, the second insulating layer has second openings such that the second openings are exposing second conductor pads including portions of the second conductor layer, each of the first conductor pads has a first plating layer recessed with respect to outer surface of the first insulating layer, and each of the second conductor pads has a second plating layer formed flush with outer surface of the second insulating layer or having bump shape protruding from the outer surface of the second insulating layer.

20 Claims, 16 Drawing Sheets

(51) Int. Cl.

| | | |
|---|---|---|
| *H01L 21/48* | (2006.01) | |
| *C23C 18/32* | (2006.01) | |
| *C23C 18/42* | (2006.01) | |
| *C23C 18/31* | (2006.01) | |
| *C23C 18/16* | (2006.01) | |
| *H01L 23/538* | (2006.01) | |
| *C25D 7/00* | (2006.01) | |
| *H05K 3/40* | (2006.01) | |
| *H01L 25/065* | (2006.01) | |
| *H01L 23/14* | (2006.01) | |
| *H01L 23/15* | (2006.01) | |
| *H05K 3/46* | (2006.01) | |
| *H05K 1/18* | (2006.01) | |

(52) U.S. Cl.
CPC ......... *H05K 3/4694* (2013.01); *H01L 23/145* (2013.01); *H01L 23/15* (2013.01); *H01L 23/49894* (2013.01); *H01L 25/0655* (2013.01); *H01L 2224/16227* (2013.01); *H01L 2924/15192* (2013.01); *H01L 2924/15313* (2013.01); *H05K 1/186* (2013.01); *H05K 3/4644* (2013.01); *H05K 3/4697* (2013.01); *H05K 2201/10378* (2013.01)

(56) References Cited

U.S. PATENT DOCUMENTS

| | | | |
|---|---|---|---|
| 2007/0256858 A1* | 11/2007 | Kariya | H01L 21/4857 174/260 |
| 2010/0032194 A1* | 2/2010 | Kato | H05K 1/113 174/260 |
| 2010/0263923 A1* | 10/2010 | Kodani | H01L 21/4853 174/260 |
| 2014/0117552 A1* | 5/2014 | Qian | H01L 23/49827 257/762 |
| 2014/0174807 A1* | 6/2014 | Roy | H01L 25/0655 174/261 |
| 2014/0301058 A1* | 10/2014 | Sunohara | H01L 23/49822 361/783 |
| 2014/0360768 A1* | 12/2014 | Kang | H05K 3/4007 174/261 |

* cited by examiner

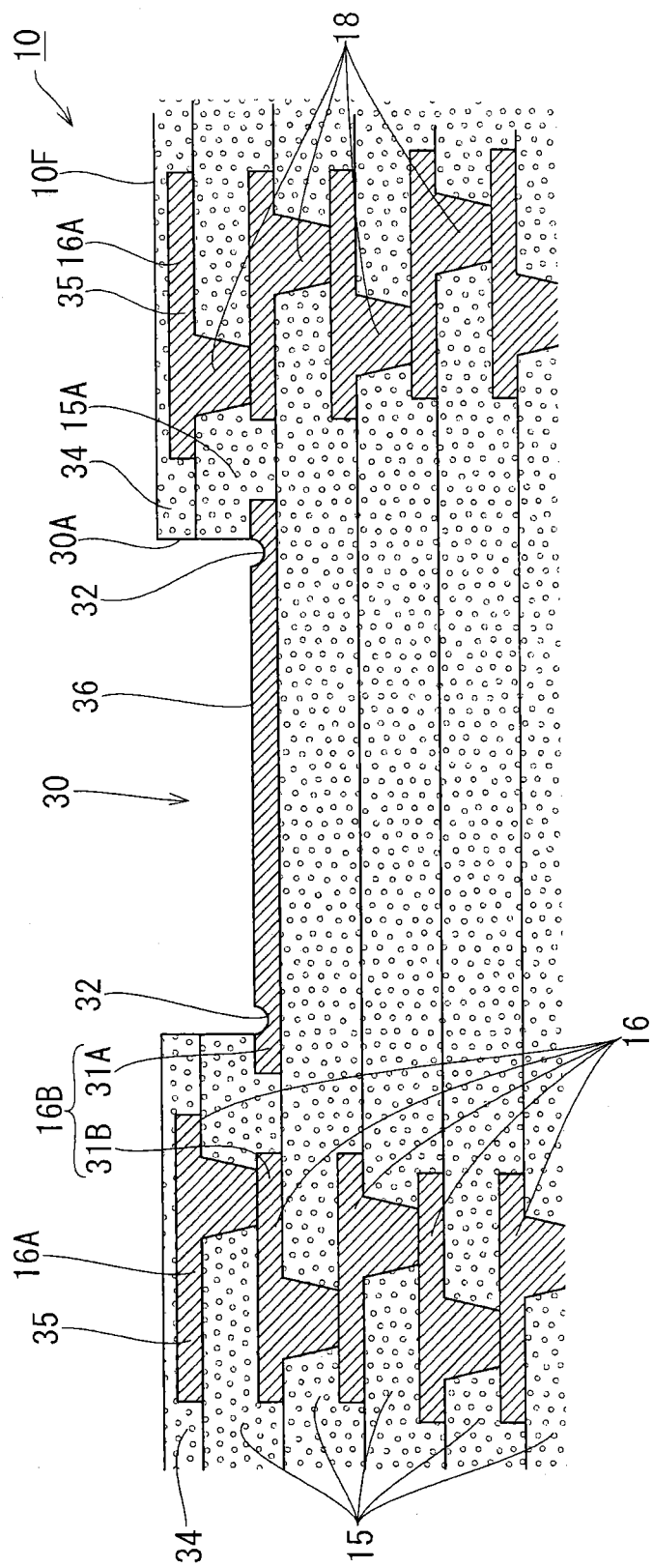

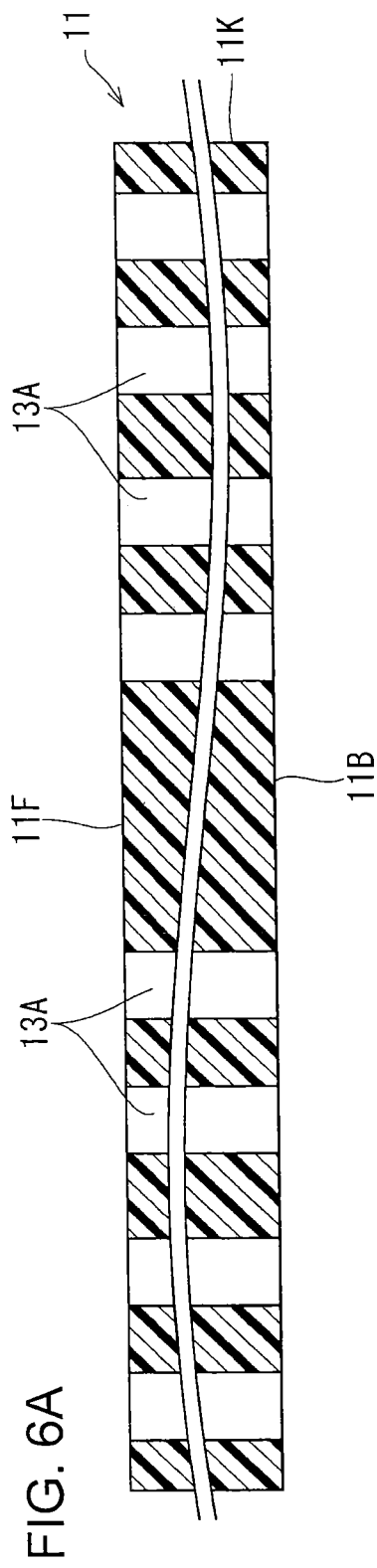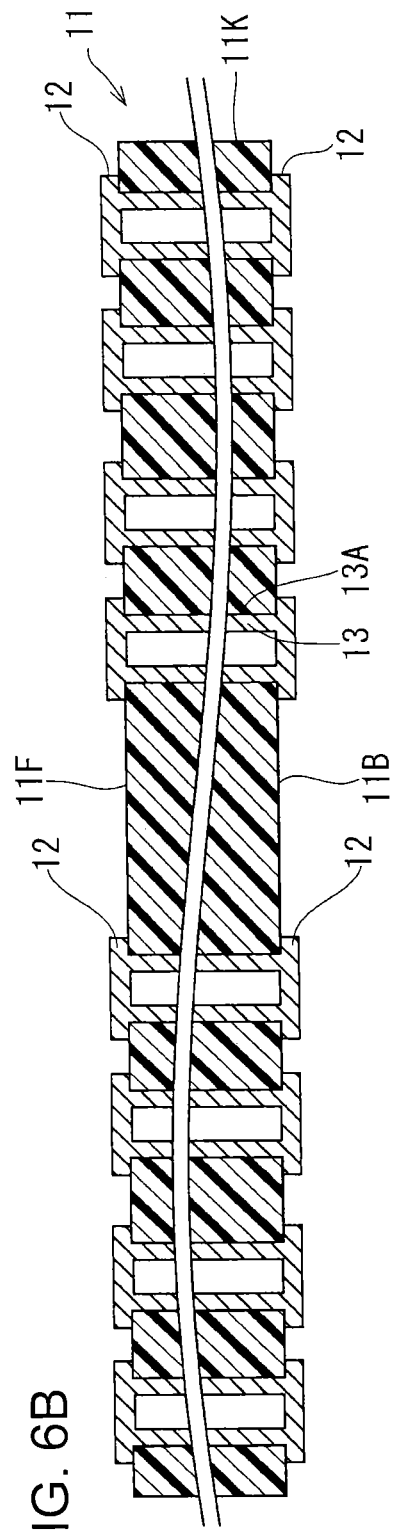

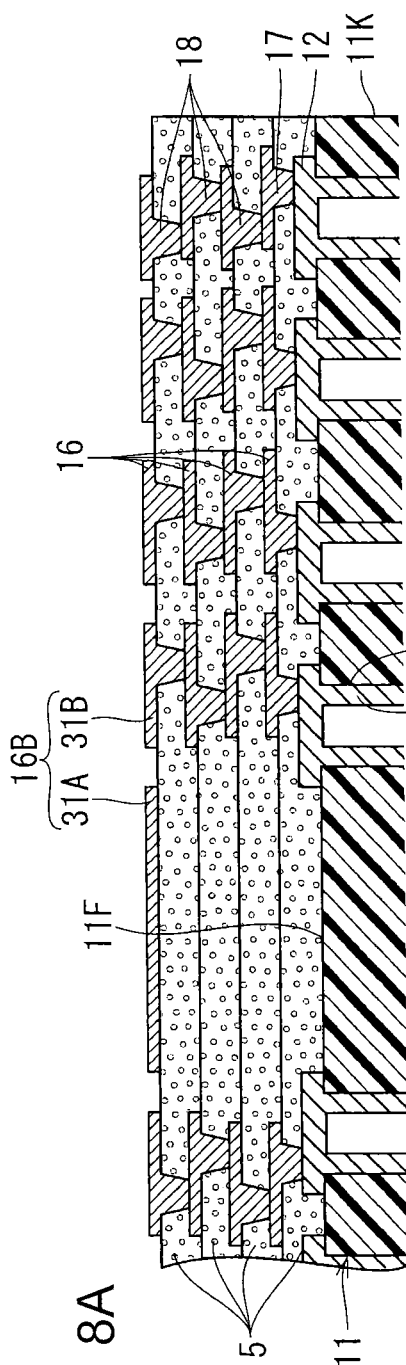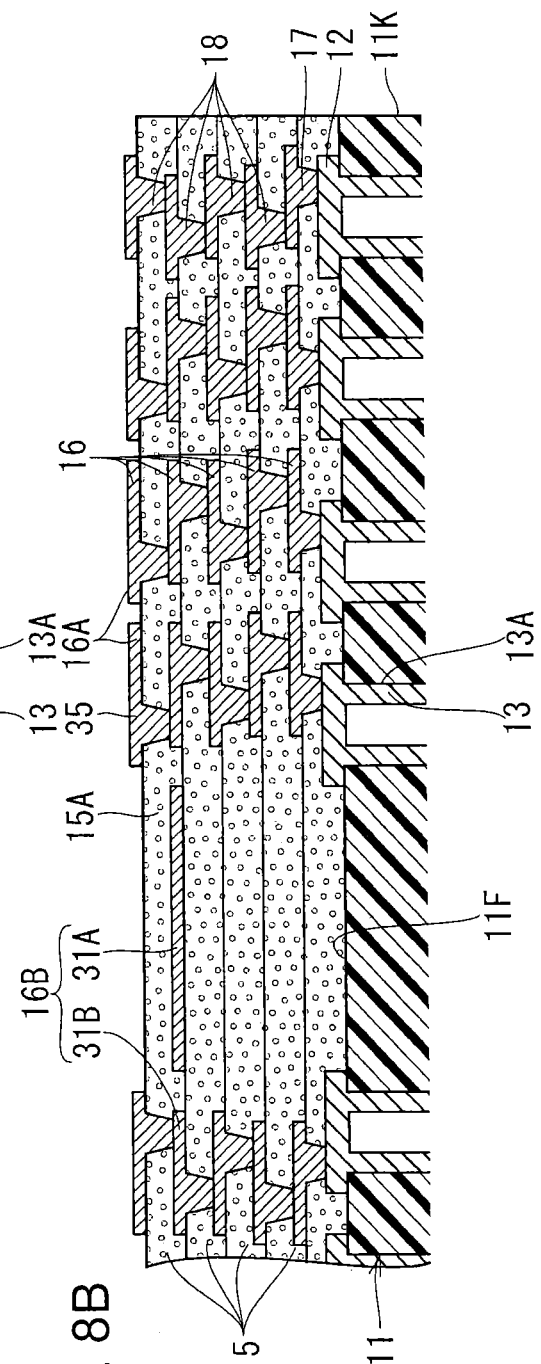

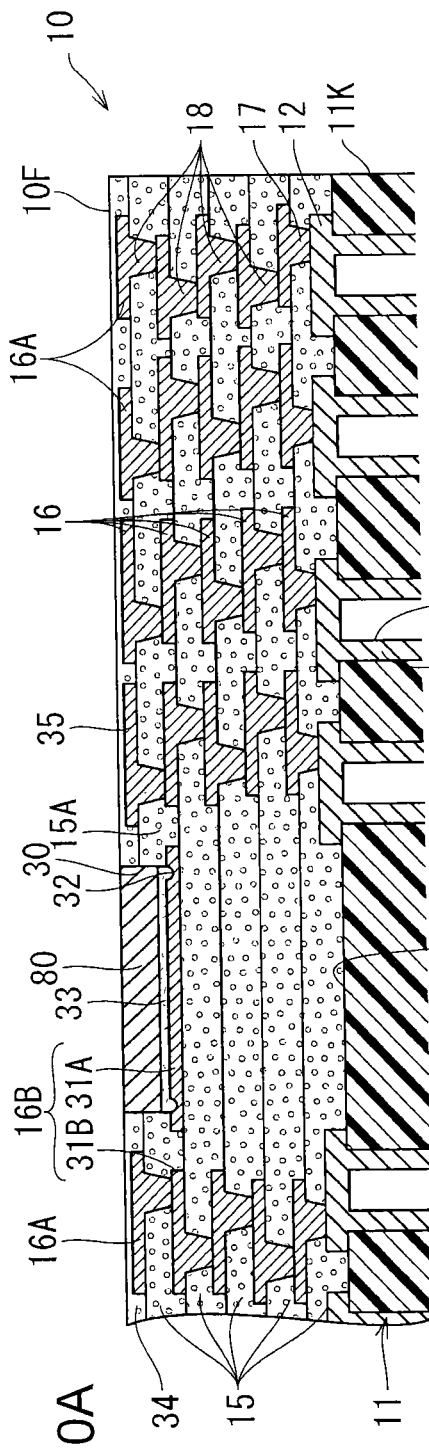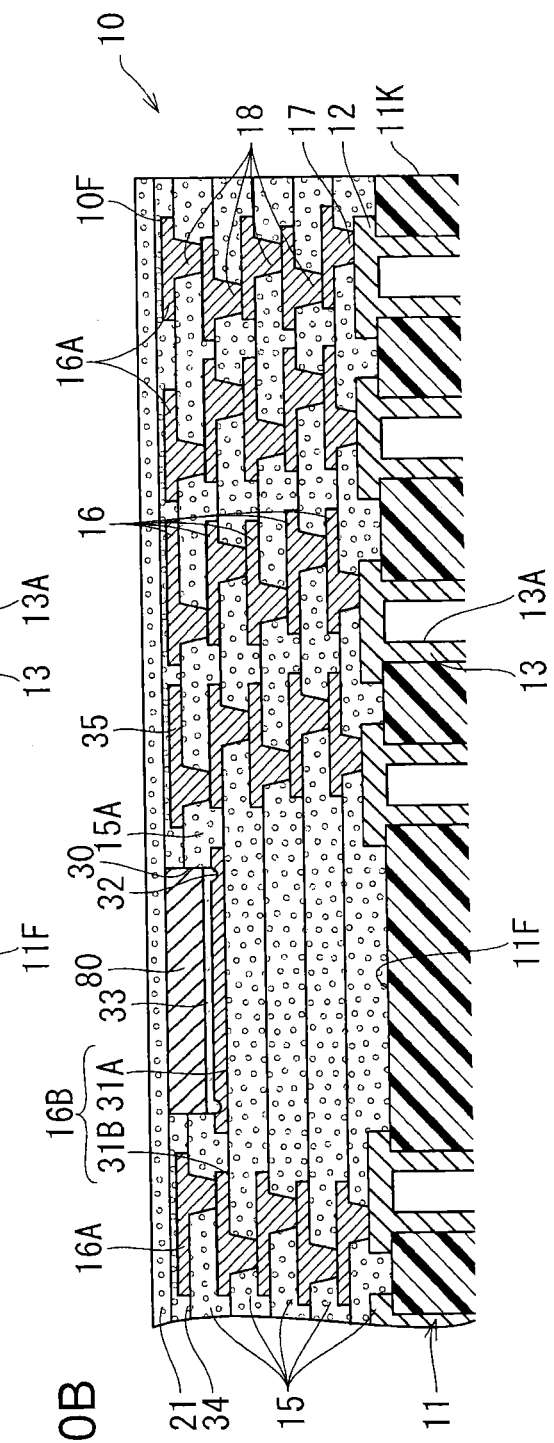
FIG. 10A
FIG. 10B

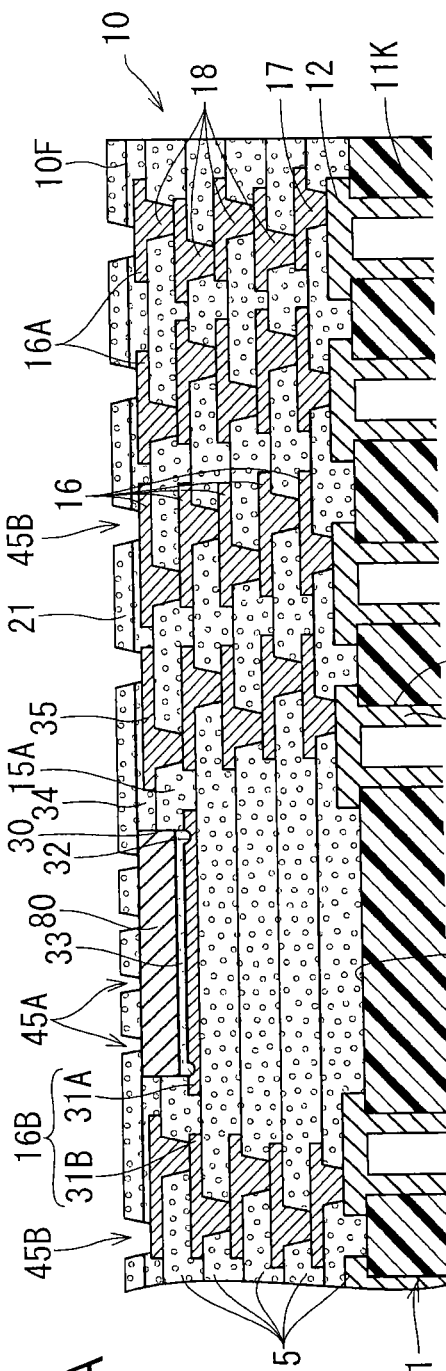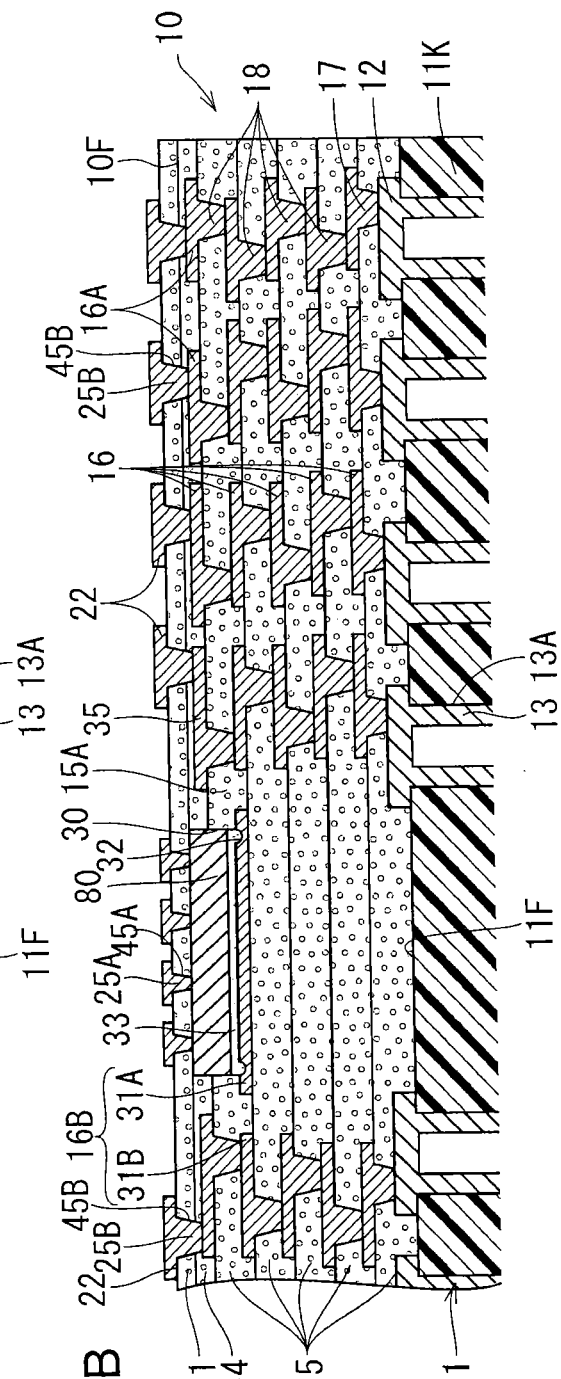

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2014-144674, filed Jul. 15, 2014, the entire contents of which are incorporated herein by reference.

BACKGROUND OF THE INVENTION

Field of the Invention

The present invention relates to a wiring substrate in which an opening that exposes a portion of a conductor layer as a conductor pad is formed in a solder resist layer that covers an outer side of the conductor layer, and relates to a method for manufacturing the wiring substrate.

Description of Background Art

In a wiring substrate, an electroless plating layer may be formed on a conductor pad, and a solder bump that protrudes from a solder resist layer to an outer side may be formed on the electroless plating layer (for example, see Re-publication of PCT International Publication No. 2007-129545). The entire contents of this publication are incorporated herein by reference.

SUMMARY OF THE INVENTION

According to one aspect of the present invention, a wiring substrate includes a first outermost conductor layer, a first outermost insulating layer formed on the first outermost conductor layer such that the first outermost insulating layer is covering the first outermost conductor layer, a second outermost conductor layer formed on the opposite side of the first outermost conductor layer, and a second outermost insulating layer formed on the second outermost conductor layer such that the second outermost insulating layer is covering the second outermost conductor layer. The first outermost insulating layer has first openings such that the first openings are exposing first conductor pads including portions of the first outermost conductor layer, respectively, the second outermost insulating layer has second openings such that the second openings are exposing second conductor pads including portions of the second outermost conductor layer, respectively, each of the first conductor pads has a first plating layer recessed with respect to an outer surface of the first outermost insulating layer, and each of the second conductor pads has a second plating layer formed flush with an outer surface of the second outermost insulating layer or having a bump shape protruding from the outer surface of the second outermost insulating layer.

According to one aspect of the present invention, a method for manufacturing a wiring substrate includes forming a first outermost insulating layer on a first outermost conductor layer such that the first outermost insulating layer covers the first outermost conductor layer, forming a second outermost insulating layer on a second outermost conductor layer on the opposite side of the first outermost conductor layer such that the second outermost insulating layer covers the second outermost conductor layer, forming first openings in the first outermost insulating layer such that the first openings expose first conductor pads including portions of the first outermost conductor layer, respectively, forming second openings in the second outermost insulating layer such that the second openings expose second conductor pads including portions of the second outermost conductor layer, respectively, forming a first plating layer on each of the first conductor pads such that the first plating layer is recessed with respect to an outer surface of the first outermost insulating layer, and forming a second plating layer on each of the second conductor pads such that the second plating layer is formed flush with an outer surface of the second outermost insulating layer or has a bump shape protruding from the outer surface of the second outermost insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is an enlarged cross-sectional around the cavity of the wiring board with the cavity;

FIGS. 6A and 6B illustrate manufacturing processes of the wiring board with the cavity;

FIGS. 8A and 8B illustrate manufacturing processes of the wiring board with the cavity;

FIGS. 10A and 10B illustrate manufacturing processes of the wiring substrate;

FIGS. 11A and 11B illustrate manufacturing processes of the wiring substrate;

DETAILED DESCRIPTION OF THE EMBODIMENTS

Figure 1:
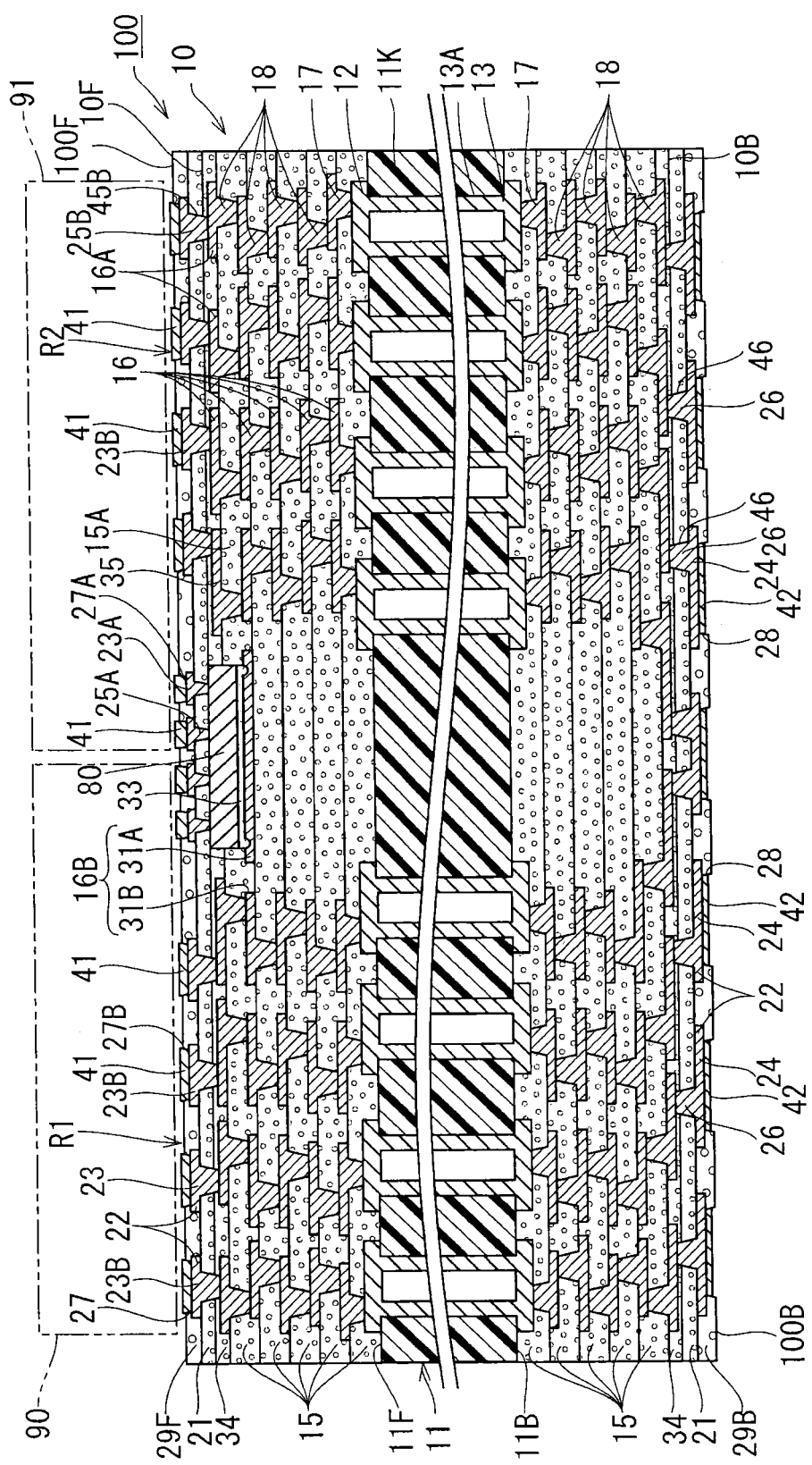
FIG. 1 illustrates a cross-sectional view of a wiring substrate according to an embodiment of the present invention.

The embodiments will now be described with reference to the accompanying drawings, wherein like reference numerals designate corresponding or identical elements throughout the various drawings.

In the following, an embodiment of the present invention is described based on FIG. 1-15. As illustrated in FIG. 1, a wiring substrate 100 according to the present embodiment is a wiring substrate with a built-in electronic component, having a built-in interposer 80 as the electronic component. The wiring substrate 100 has a structure in which an outer side build-up insulating layer 21 and an outer side build-up conductor layer 22 are laminated on each of both front and back surfaces of a wiring board 10 with a cavity (the interposer 80 being accommodated in the cavity 30) (see FIG. 3), and the outer side build-up conductor layers 22 are respectively covered by the first solder resist layer (29B) and the second solder resist layer (29F). The first solder resist layer (29B) forms a B surface (100B), which is a back side surface of the wiring substrate 100. The second solder resist layer (29F) forms an F surface (100F), which is a back side surface of the wiring substrate 100. The solder resist layers (29F, 29B) each have a thickness of about 10-20 μm. The outer side build-up insulating layer 21 has a thickness of about 15 μm. The outer side build-up layer 22 has a thickness of about 15 μm.

Figure 3:
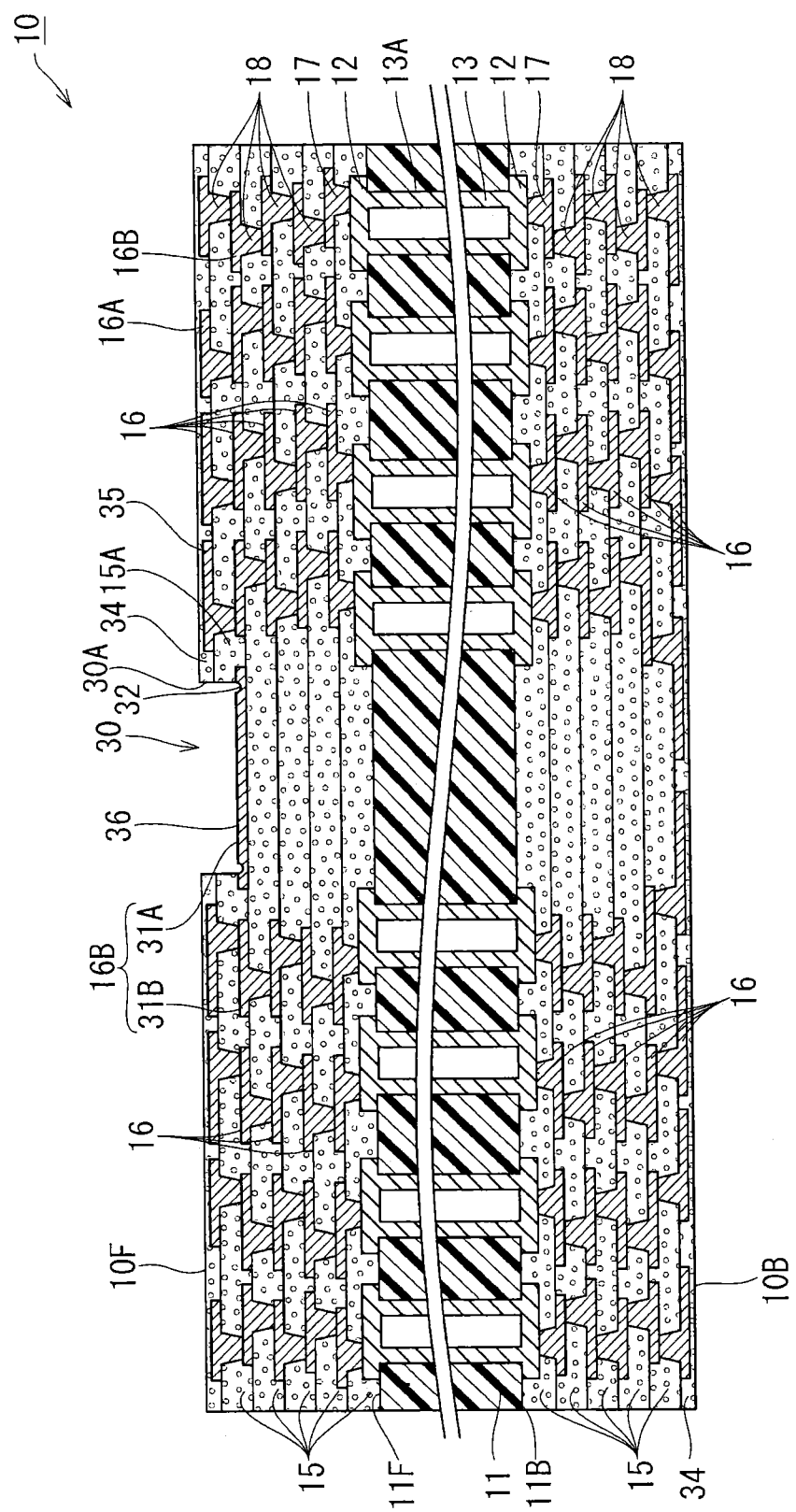
FIG. 3 is a cross-sectional view of a wiring board with a cavity.

As illustrated in FIG. 3, the wiring board 10 with the cavity has a multilayer structure in which build-up insulating layers 15 and build-up conductor layers 16 are alternately laminated on each of both an F surface (11F), which is a front side surface of a core substrate 11, and a B surface (11B), which is a back side surface of the core substrate 11.

The core substrate 11 has a thickness of about 700 μm. A core conductor layer 12 is formed on each of both the front and back surfaces of the core substrate 11. The core conductor layer 12 has a thickness of about 35 μm. The build-up insulating layers 15 are each formed of an insulating material and each have a thickness of about 25-30 μm. The build-up conductor layers 16 are each formed of metal (such as copper) and each have a thickness of about 15 μm.

The front side core conductor layer 12 and the back side core conductor layer 12 are connected by a through-hole conductor 13 that penetrates through the core substrate 11. The through-hole conductor 13 is formed by forming, for example, copper plating on a wall surface of a through hole (13A) that penetrates through the core substrate 11.

An innermost build-up conductor layer 16, which is closest to the core substrate 11, and the core conductor layer 12 are connected by a via 17 that penetrates through an innermost build-up insulating layer 15. Further, build-up conductor layers (16, 16) that are adjacent to each other in a lamination direction are connected by a via 18 that penetrates through a build-up insulating layer 15 that is positioned between the build-up conductor layers (16, 16).

A conductor circuit layer (31B) and a plane layer (31A) are formed in a second build-up conductor layer (16B) that is among the build-up conductor layers 16 laminated on the F surface (11F) side of the core substrate 11 and is positioned second from an outer side. The plane layer (31A) is formed, for example, in a solid shape as an independent conductor layer or as a ground layer that is grounded.

An outer side conductor circuit layer 35 is formed that is connected via the via 18 to the conductor circuit layer (31B) in the second build-up conductor layer (16B) that is among the build-up conductor layers 16 laminated on the F surface (11F) side of the core substrate 11 and is positioned second from the outer side. Further, a protective layer 34 is laminated on a second build-up conductor layer (16A). The protective layer 34 is formed of the same material as the build-up insulating layers 15. The protective layer 34 has a thickness of about 15 μm and is thinner than each of the build-up insulating layers 15. The protective layers 34 respectively form an F surface (10F), which is a front side surface of the wiring board 10 with the cavity, and a B surface (10B), which is a back side surface of the wiring board 10 with the cavity.

The cavity 30 having an opening 30A on the F surface (10F) of the wiring board 10 is formed in the wiring board 10 with the cavity. The cavity 30 penetrates through a first build-up insulating layer (15A) positioned on an outermost side and the protective layer 34, and exposes the plane layer (31A) as a bottom surface.

As illustrated in FIG. 4, an area of the opening (30A) of the cavity 30 is smaller than an area of the plane layer (31A), and an outer peripheral portion of the plane layer (31A) protrudes to outer side of the cavity 30. In other words, the plane layer (31A) forms the entire bottom surface of the cavity 30. Further, a recess 32 is formed in an outer peripheral portion of the portion of the plane layer (31A) that is exposed as the bottom surface of the cavity 30. The recess 32 has a depth of about 0.5-3 μm. A roughened layer 36 is formed on a surface of the portion of the plane layer (31A) that is exposed as the bottom surface of the cavity 30.

As illustrated in FIG. 1, electronic component mounting regions (R1, R2) for mounting electronic components (90, 91) including a semiconductor element and the like are formed on the F surface (100F) of the wiring substrate 100. The cavity 30 is arranged on an inner side of a boundary portion of the electronic component mounting regions (R1, R2). The interposer 80 that electrically connects the electronic components (90, 91) mounted in the electronic component mounting regions (R1, R2) is accommodated in the cavity 30. The electronic component 90 is, for example, an MPU or a CPU, and the electronic component 91 is, for example, a memory.

Figure 2:
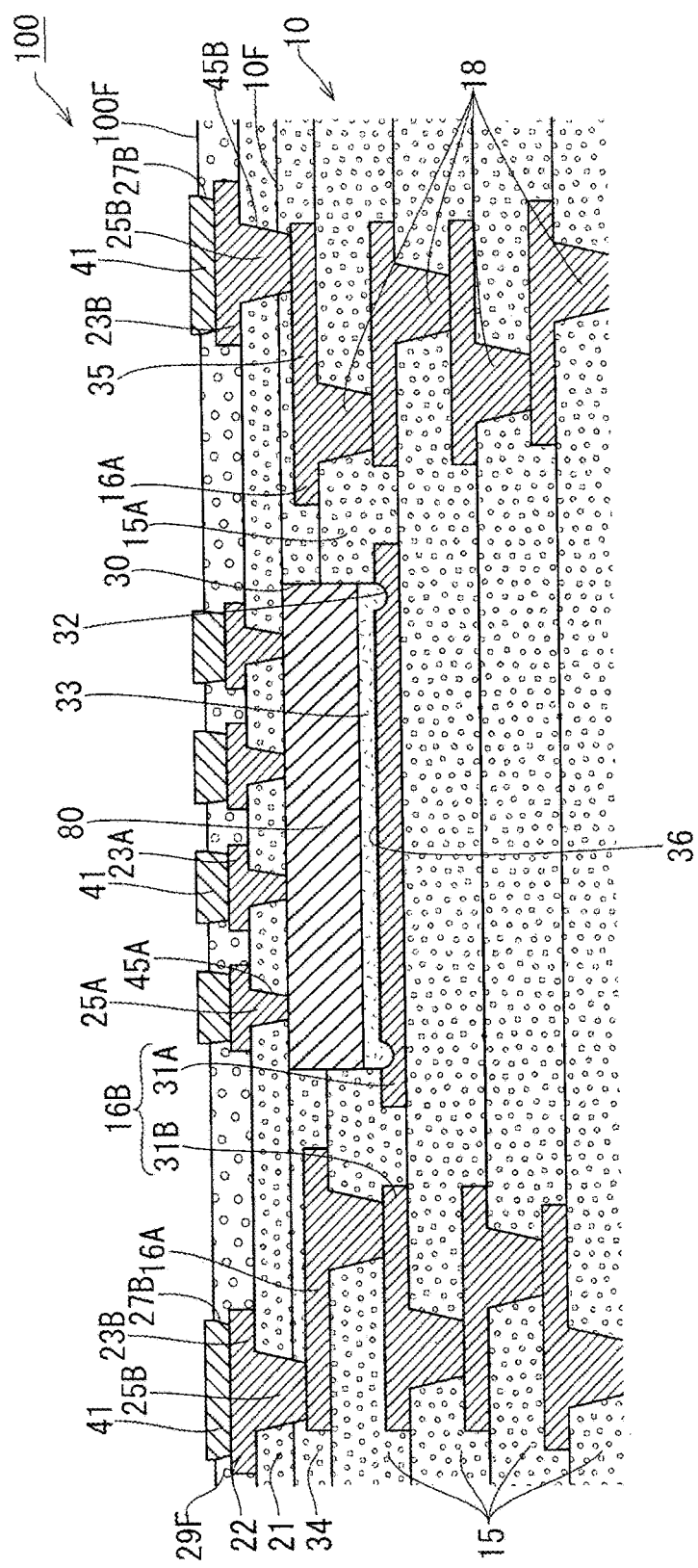
FIG. 2 is an enlarged cross-sectional view around an interposer of the wiring substrate.

Specifically, as illustrated in FIG. 2, a bonding layer 33 is formed on the plane layer (31A) that is exposed as the bottom surface of the cavity 30, and the interposer 80 is mounted on the bonding layer 33. Here, due to the recess 32 of the plane layer (31A), an anchor effect is exerted on the bonding layer 33, and peeling of the bonding layer 33 from the plane layer (31A) is suppressed. In addition, due to the roughened layer 36 that is formed on the surface of the plane layer (31A) that is exposed as the bottom surface of the cavity 30, peeling of the bonding layer 33 from the plane layer (31A) is further suppressed.

As illustrated in FIG. 1, first openings 28 that each expose a portion of the outer side build-up conductor layer 22 as a first conductor pad 24 are formed in the first solder resist layer (29B) that forms the B surface (100B) of the wiring substrate 100. The first conductor pads 24 are each connected to the first build-up conductor layer (16A) via a first via 26 that penetrates through the outer side build-up insulating layer 21.

Figures 5A, 5B:
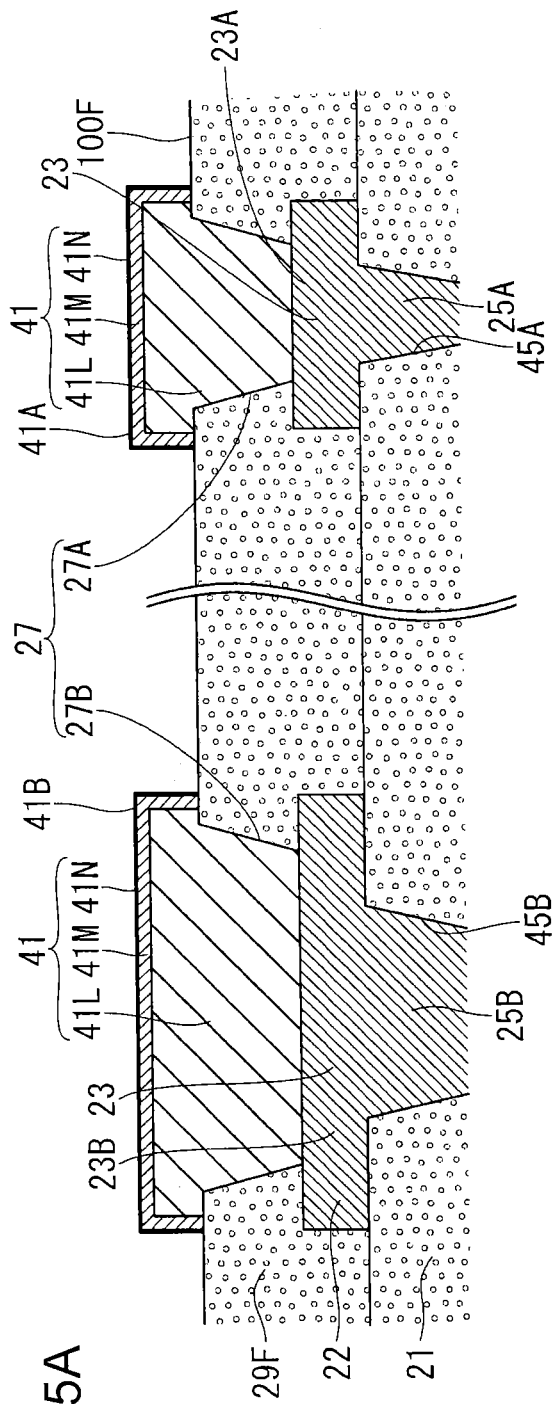
FIG. 5A is a cross-sectional view of a second plating layer.
FIG. 5B is a cross-sectional view of a first plating layer.

First plating layers 42 are respectively formed on the first conductor pads 24. The first plating layers 42 are each recessed with respect to an outer surface of the first solder resist layer (29B). As illustrated in FIG. 5B, the first plating layers 42 are each formed by electroless Ni/Pd/Au metal layers. Of the electroless Ni/Pd/Au metal layers of each of the first plating layers 42, the Ni layer (42L) has a thickness of 3-10 μm; the Pd layer (42M) has a thickness of 0-1 μm; and the Au layer (42N) has a thickness of 0.03-0.1 μm. The first plating layers 42 each have an outer diameter of 80-150 μm. Among the first plating layers 42, a distance (pitch) between adjacent first plating layers (42, 42) is 150-300 μm. The thickness of the Pd layer (42M) may be 0 μm. In this case, the first plating layers 42 are each formed by the electroless Ni/Au metal layers.

As illustrated in FIG. 1, second openings 27 that each expose a portion of the outer side build-up conductor layer 22 as a second conductor pad 23 are formed in the second solder resist layer (29F) that forms the F surface (100F) of the wiring substrate 100. Specifically, the second openings 27 include second small-diameter openings (27A) and second large-diameter openings (27B). The second small-diameter openings (27A) each expose a portion of the outer side build-up conductor layer 22 as a second small-diameter conductor pad (23A). The second large-diameter openings (27B) each expose a portion of the outer side build-up conductor layer 22 as a second large-diameter conductor pad (23B). As illustrated in FIG. 2, the second large-diameter conductor pad (23B) is connected to the first build-up layer (16A) via a second large-diameter via (25B) that penetrates through the outer side build-up insulating layer 21 and the bonding layer 34. Further, the second small-diameter conductor pad (23A) is connected to the interposer 80 via a second small-diameter via (25A) that penetrates through the outer side build-up insulating layer 21.

Second plating layers 41 are respectively formed on the second small-diameter conductor pads (23A) and the second large-diameter conductor pads (23B). The second plating layers 41 each protrude in a bump-like shape to an outer side of the second solder resist layer (29F), and an amount of the protrusion of the second plating layer 41 from an outer surface of the second solder resist layer (29F) is 0-15 μm. Further, the amount of the protrusion from the outer surface of the second solder resist layer (29F) is substantially the same among the second plating layers 41. As illustrated in FIG. 5A, similar to the first plating layers 42, the second plating layers 41 are each formed by electroless Ni/Pd/Au metal layers. Of the electroless Ni/Pd/Au metal layers of each the second plating layers 41, the Ni layer (41L) has a thickness of 10-35 μm; the Pd layer (41M) has a thickness of 0.1-1 μm; and the Au layer (41N) has a thickness of 0.03-0.1 μm. The second plating layers 41 on the second small-diameter conductor pads (25A) respectively penetrate through the second small-diameter openings (27A), and the second plating layers 41 on the second large-diameter conductor pads (25B) respectively penetrate through the second large-diameter openings (27B). Here, when the second plating layers 41 that penetrate through the second small-diameter openings (27A) and the second plating layers 41 that penetrate through the second large-diameter openings (27B) are respectively referred to as second small-diameter plating layers (41A) and second large-diameter plating layers (41B) to be distinguished from each other, the second small-diameter plating layers (41A) each have an outer diameter of 20-30 μm, and a distance (pitch) between adjacent second small-diameter plating layers (41A, 41A) among the second small-diameter plating layers (41A) is 40-60 μm. Further, the second large-diameter plating layers (41B) each have an outer diameter of 50-90 μm, and a distance (pitch) between adjacent second large-diameter plating layers (41B, 41B) among the second large-diameter plating layers (41B) is 90-180 μm.

In the present embodiment, the first solder resist layer (29B) and the second solder resist layer (29F) respectively correspond to a "first insulating layer" and a "second insulating layer" according to an embodiment of the present invention. Further, the outer side build-up conductor layer 22 on the B surface (100B) side that is covered by the first solder resist layer (29B) correspond to a "first conductor layer" according to an embodiment of the present invention, and the outer side build-up conductor layer 22 on the F surface (100F) side that is covered by the second solder resist layer (29F) corresponds to a "second conductor layer" according to an embodiment of the present invention.

The description about the structure of the wiring substrate 100 is as given above. Next, a method for manufacturing the wiring substrate 100 is described. Here, since the wiring substrate 100 is manufactured using the wiring board 10 with the cavity, in the following, first, a method for manufacturing the wiring board 10 with the cavity is described.

The wiring board 10 with the cavity is manufactured as follows.

(1) As illustrated in FIG. 6A, the through hole (13A) is formed in the core substrate 11 by, for example, drilling or the like. The core substrate 11 is obtained by laminating a copper foil (not illustrated in the drawings) on each of both an F surface (11F), which is a front side surface of an insulating base material (11K), and a B surface (11B), which is a back side surface of the insulating base material (11K), the insulating base material (11K) being made of epoxy resin or BT (bismaleimide triazine) resin and a reinforcing material such as a glass cloth.

(2) By an electroless plating treatment, a plating resist treatment and an electrolytic plating treatment, the core conductor layer 12 is formed on each of the F surface (11F) and the B surface (11B) of the core substrate 11, and the through-hole conductor 13 is formed on an inner surface of the through hole (13A) (see FIG. 6B).

Figure 7A:
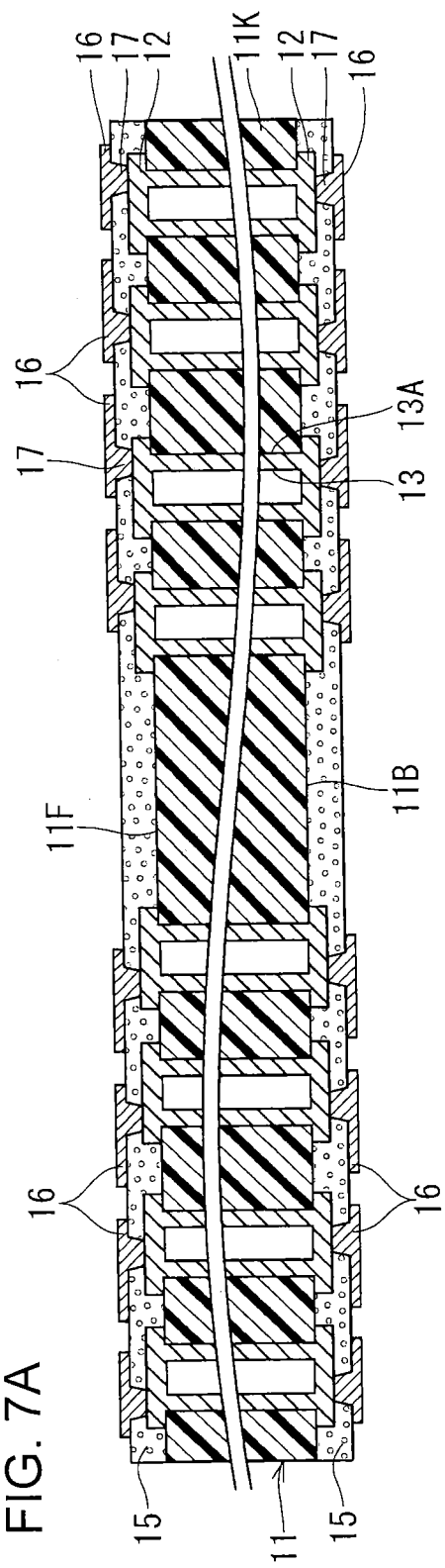
FIGS. 7A and 7B illustrate manufacturing processes of the wiring board with the cavity.

(3) As illustrated in FIG. 7A, a build-up insulating layer 15 is laminated on the core conductor layer 12, and a build-up conductor layer 16 is laminated on the build-up insulating layer 15. Specifically, a prepreg (a resin sheet of a B-stage formed by impregnating a core material with resin) as a build-up insulating layer 15 and a copper foil (not illustrated in the drawings) are laminated on the core conductor layer 12 on each of the F surface (11F) side and the B surface (11B) side of the core substrate 11. Then, the resulting substrate is hot-pressed. Then, $CO_2$ laser is irradiated to the copper foil, and a via formation hole that penetrates through the copper foil and the build-up insulating layer 15 is formed. Then, an electroless plating treatment, a plating resist treatment and an electrolytic plating treatment are performed. The via formation hole is filled with electrolytic plating and a via 17 is formed, and a build-up conductor layer 16 of a predetermined pattern is formed on the build-up insulating layer 15. Instead of the prepreg, it is also possible to use a resin film that does not contain a core material as the build-up insulating layer 15. In this case, without laminating a copper foil, a conductor layer can be directly formed on a surface of the resin film using a semi-additive method.

Figure 7B:
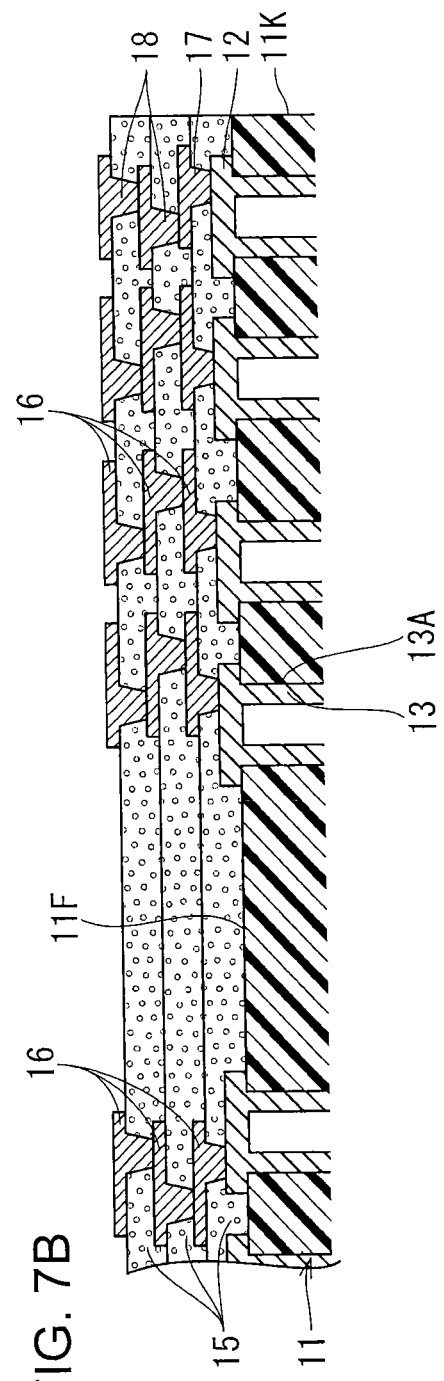

(4) Similar to the process of FIG. 7A, build-up insulating layers 15 and build-up conductor layers 16 are alternately laminated on each of the F surface (11F) side and the B surface (11B) side of the core substrate 11 (see FIG. 7B; in FIG. 7B, only the F surface (11F) side is illustrated; this applies also in FIGS. 8A, 8B, 9A and 9B in the following). In this case, a via 18 that penetrates through a build-up insulating layer 15 is formed, and build-up insulating layers 16, 16 that are adjacent to each other in the lamination direction are connected by the via 18.

(5) As illustrated in FIG. 8A, a build-up insulating layer 15 is laminated and a build-up conductor layer 16 is laminated on the build-up insulating layer 15, and the second build-up conductor layer (16B) is formed. In this case, the conductor circuit layer (31B), which is connected to an inner side build-up conductor layer 16 via a via 18, and the solid-shaped plane layer (31A) are formed in the second build-up conductor layer (16B).

(6) As illustrated in FIG. 8B, on the second build-up conductor layer (16B), a build-up insulating layer 15 and a build-up conductor layer 16 are laminated, and the first build-up insulating layer (15A) and the first build-up conductor layer (16A) are formed. In this case, on the plane layer (31A), only the first build-up insulating layer (15A) is laminated. Further, in the first build-up conductor layer (16A), the outer side conductor circuit layer 35 is formed that is connected to the conductor circuit layer (31B) via a via 18 that penetrates through the first build-up insulating layer (15A).

Figure 9A:
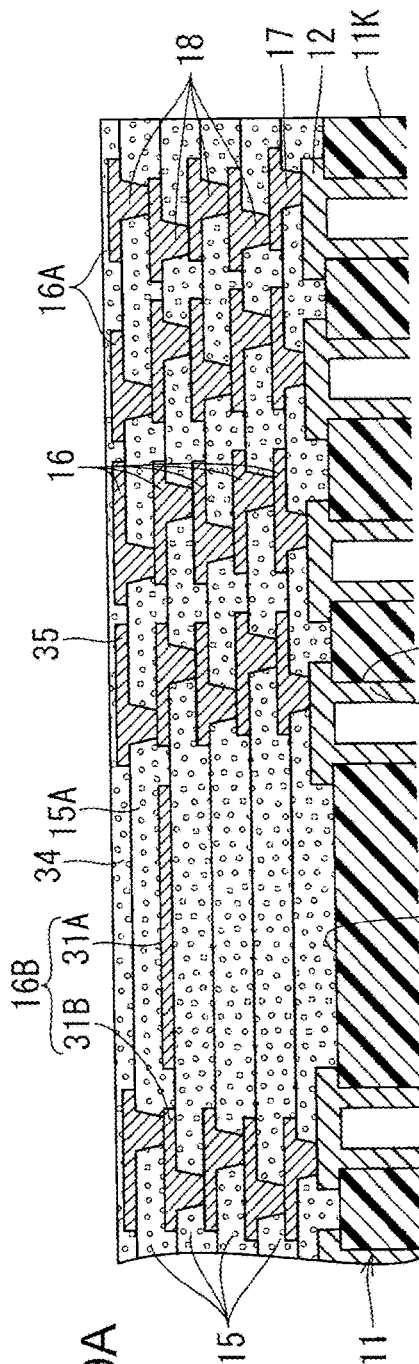
FIGS. 9A and 9B illustrate manufacturing processes of the wiring board with the cavity.

(7) As illustrated in FIG. 9A, on the build-up conductor layer 16, the protective layer 34 made of the same material as the build-up insulating layer 15 is laminated. In this case, on the plane layer (31A), the build-up layer 15 and the protective layer 34 are laminated.

Figure 9B:
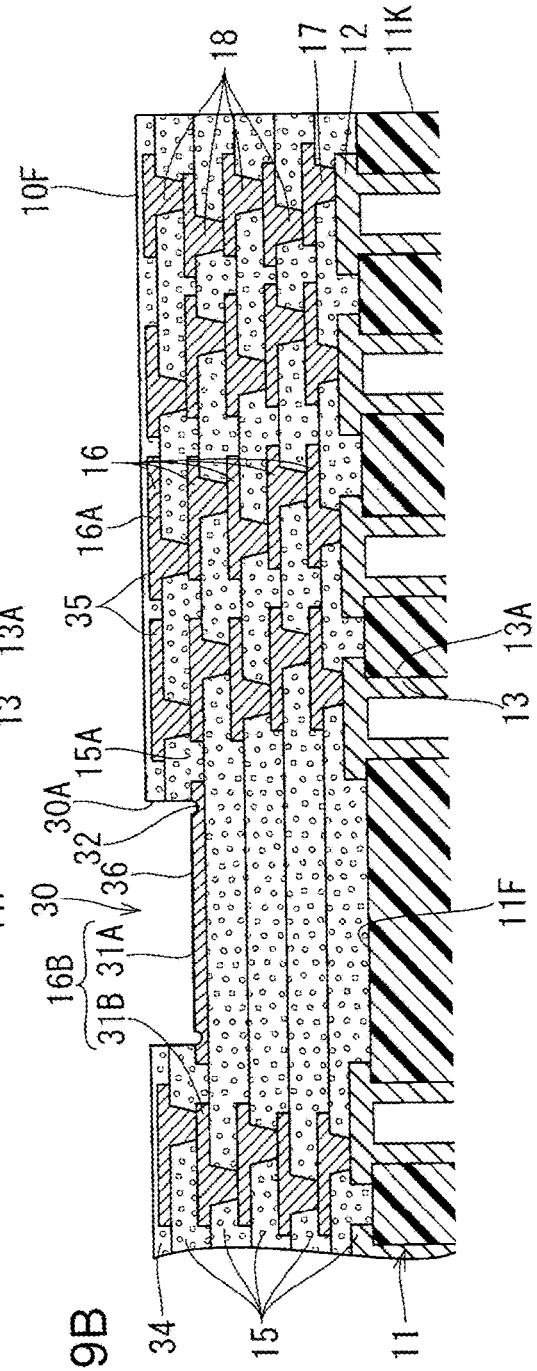

(8) As illustrated in FIG. 9B, by irradiating, for example, CO2 laser from the F surface (11F) side of the core substrate 11, the cavity 30 is formed that penetrates through the protective layer 34 and the first build-up insulating layer (15A) to expose the plane layer (31A) as a bottom surface. Here, an area of a range in which laser is irradiated, that is, an opening area of the cavity 30, is smaller than an area of the plane layer (31A), so that the entire bottom surface of the cavity 30 is formed by the plane layer (31A) alone. Further, by strongly irradiating laser to the outer peripheral portion of the cavity 30, the recess 32 is formed in the outer peripheral portion of the portion of the plane layer (31A) that is exposed as the bottom surface of the cavity 30.

(9) The plane layer (31A) that is exposed as the bottom surface of the cavity 30 is subjected to a desmear treatment, and the roughened layer 36 is formed on the surface of the plane layer (31A) by a roughening treatment. When the desmear treatment is performed, the conductor circuit layer (31B) that is contained in the second build-up conductor layer (16B) is protected by the protective layer 34. As a result, the wiring board 10 with the cavity illustrated in FIG. 3 is completed.

The above is the description of the method for manufacturing the wiring board 10 with the cavity. Next, the method for manufacturing the wiring substrate 100 using the wiring board 10 with the cavity is described.

The wiring substrate 100 is manufactured as follows.

(1) As illustrated in FIG. 10A, the bonding layer 33 is laminated on the plane layer (31A) that is exposed as the bottom surface of the cavity 30, and the interposer 80 is placed on the bonding layer 33, and a thermal curing process and a CZ process are performed.

(2) The outer side build-up insulating layer 21 made of the same material as the build-up insulating layers 15 is laminated on each of the F surface (10F) and the B surface (10B) of the wiring board 10 with the cavity (see FIG. 10B; in FIG. 10B, only the F surface (10F) side is illustrated; this applies also to FIGS. 11A and 11B).

(3) A second small-diameter via formation hole (45A) and a second large-diameter via formation hole (45B) are formed in the outer side build-up insulating layer 21 by irradiating laser from the F surface (10F) side of the wiring board 10 with the cavity (see FIG. 11A), and a first via formation hole 46 is formed by irradiating laser from the B surface (10B) side of the wiring board 10. In doing so, on the B surface (10B) side, for example, by irradiating infrared laser, the first via formation hole 46 having a relatively large diameter is formed (see FIG. 5B). Further, on the F surface (10F) side, for example, by irradiating infrared laser, the second large-diameter via formation hole (45B) having a diameter smaller than that of the first via formation hole 46 is formed, and, for example, by irradiating visible or ultraviolet laser, the second small-diameter via formation hole (45A) having a diameter smaller than that of the second large-diameter via formation hole (45B) is formed. The first via formation hole 46 has an opening diameter of about 150 μm; the second large-diameter via formation hole (45B) has an opening diameter of about 50-60 μm; and the second small-diameter via formation hole (45A) has an opening diameter of about 20-30 μm.

(4) An electroless plating treatment, a plating resist treatment and an electrolytic plating treatment are performed. On the F surface (10F) side of the wiring board 10 with the cavity, the second small-diameter via (25A) and the second large-diameter via (25B) are respectively formed in the second small-diameter via formation hole (45A) and the second large-diameter via formation hole (45B) (see FIG. 11B); and on the B surface (10B) side of the wiring board 10 with the cavity, the first via 26 is formed in the first via formation hole 46. Further, the outer side build-up conductor layer 22 is formed on the outer side build-up insulating layer 21.

Figure 12:
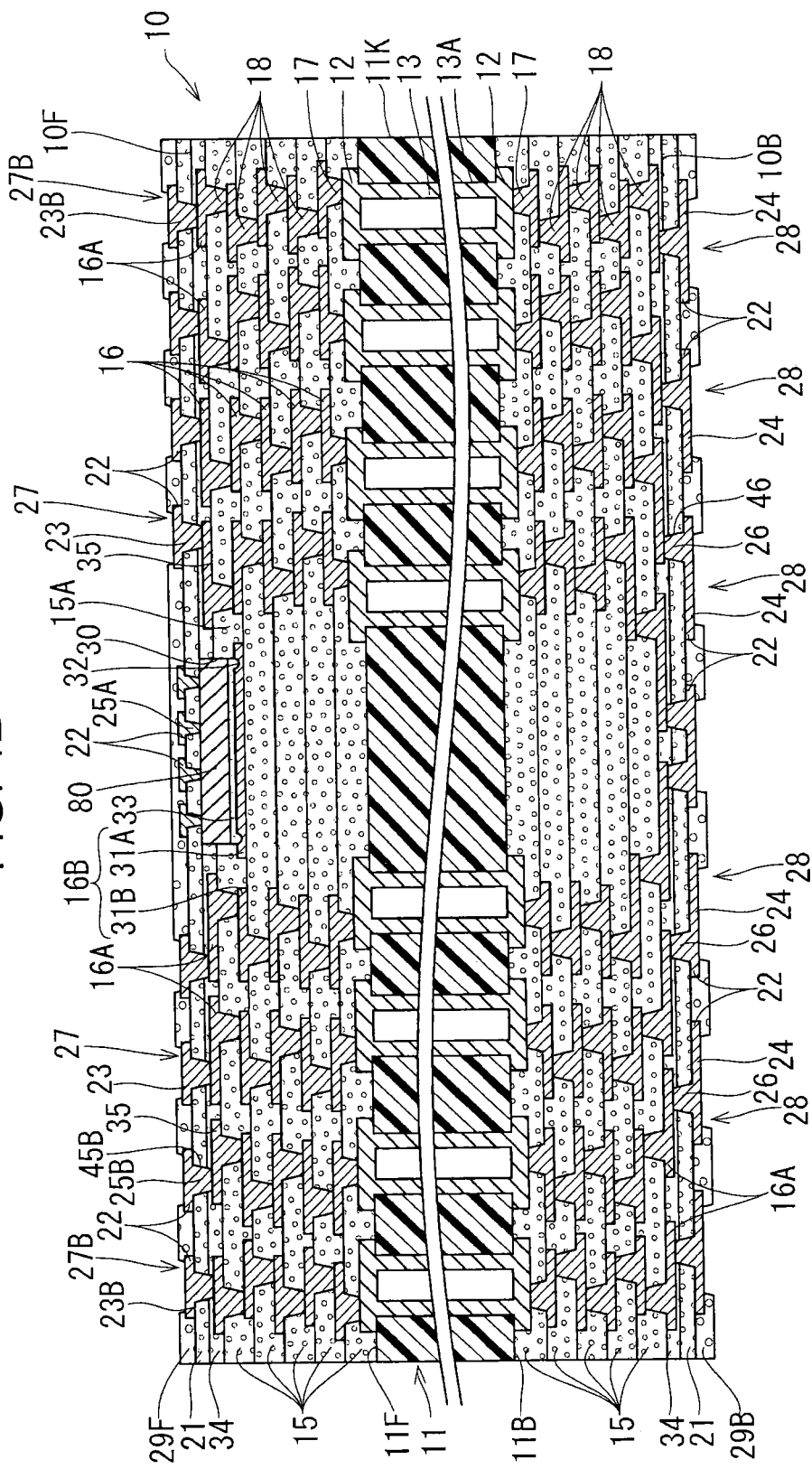
FIG. 12 illustrates a manufacturing process of the wiring substrate.

(5) As illustrated in FIG. 12, the first solder resist layer (29B) and the second solder resist layer (29F) are respectively laminated on the outer side build-up conductors layer 22 on the F surface (10F) side and the B surface (10B) side of the wiring board 10 with the cavity; and, by a lithographic treatment, the second large-diameter openings (27B) that each expose a portion of the outer side build-up conductor layer 22 as a second large-diameter conductor pad (23B) are formed in the second solder resist layer (29F) on the F surface (10F) side of the wiring board 10 with the cavity, and second openings 28 that each expose a portion of the outer side build-up conductor layer 22 as a second conductor pad 24 are formed in the first solder resist layer (29B) on the B surface (10B) side.

Figure 13:
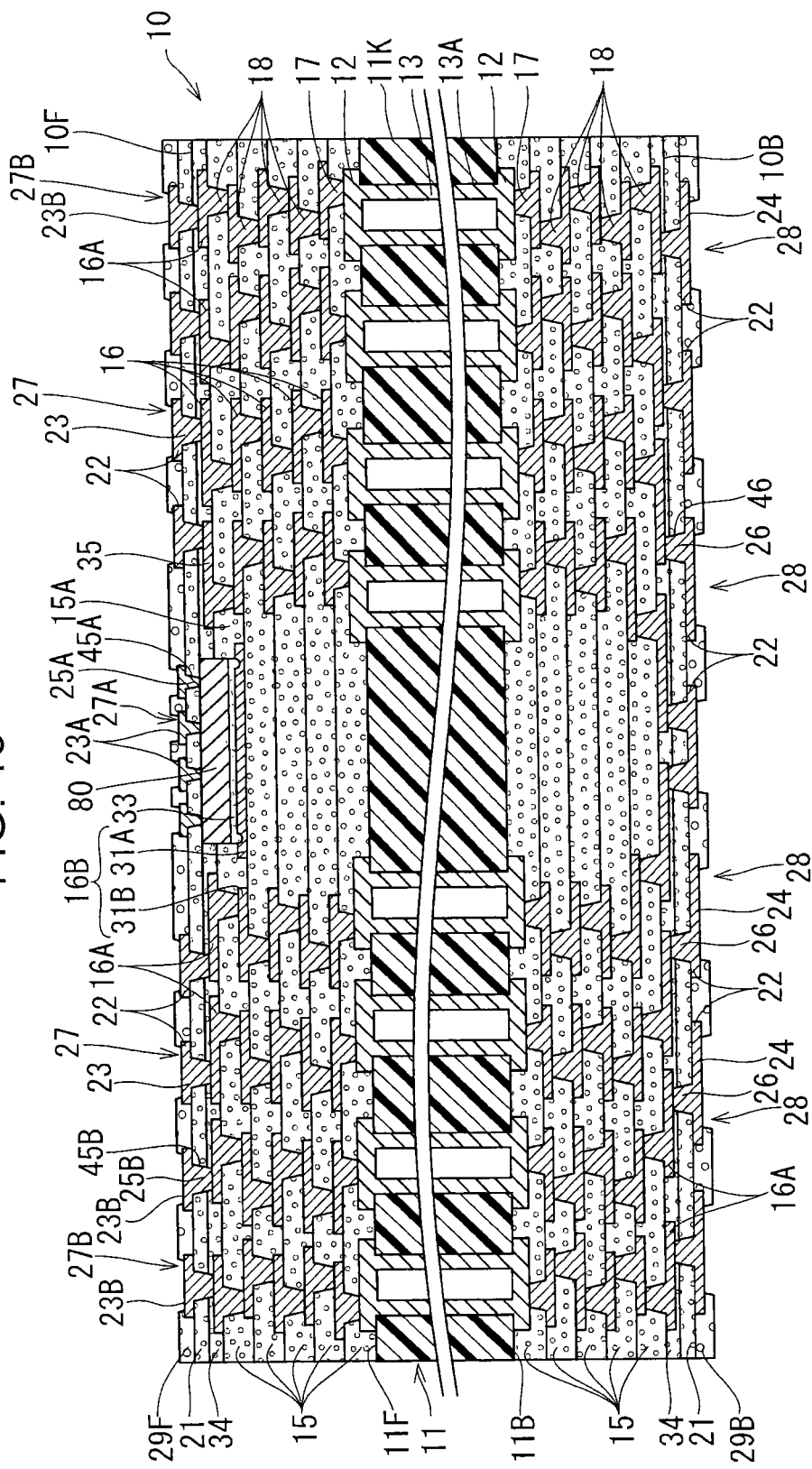
FIG. 13 illustrates a manufacturing process of the wiring substrate.

(6) As illustrated in FIG. 13, by irradiating visible or ultraviolet laser from the F surface (10F) side of the wiring board 10 with the cavity, the second small-diameter openings (27A) that each expose a portion of the outer side build-up conductor layer 22 as a second small-diameter conductor pad (23A) are formed.

Figure 14:
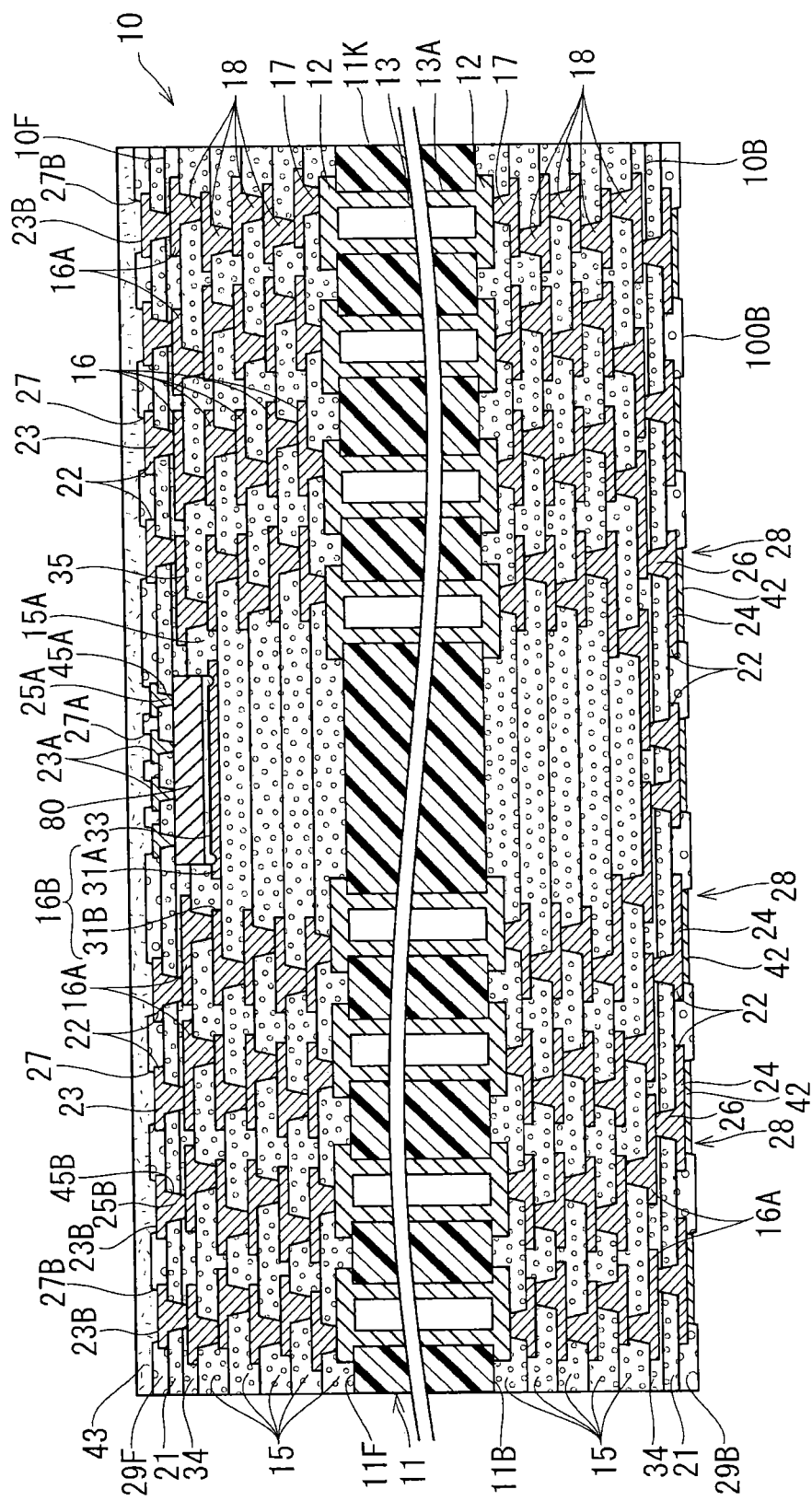
FIG. 14 illustrates a manufacturing process of the wiring substrate.

(7) As illustrated in FIG. 14, the second solder resist layer (29F) on the F surface (10F) side of the wiring board 10 with the cavity is covered by a resin protective film 43. Then, the B surface (10B) side of the wiring board 10 with the cavity is subjected to an electroless plating treatment, and the first plating layers 42 are respectively formed on the second conductor pads 24. Specifically, first, the substrate on which the first solder resist layer (29B) and the second solder resist layer (29F) are formed is immersed in an electroless nickel plating solution for a predetermined period of time, and the Ni layer (42L) is formed. Next, the substrate is immersed in an electroless palladium plating solution for a predetermined period of time, and the Pd layer (42M) is formed. Further, the substrate is immersed in an electroless gold plating solution for a predetermined period of time, and the Au layer (42N) is formed. When the electroless plating treatment is performed, the second small-diameter conductor pads (23A) and the second large-diameter conductor pads (23B) are protected by the resin protective film 43.

Figure 15:
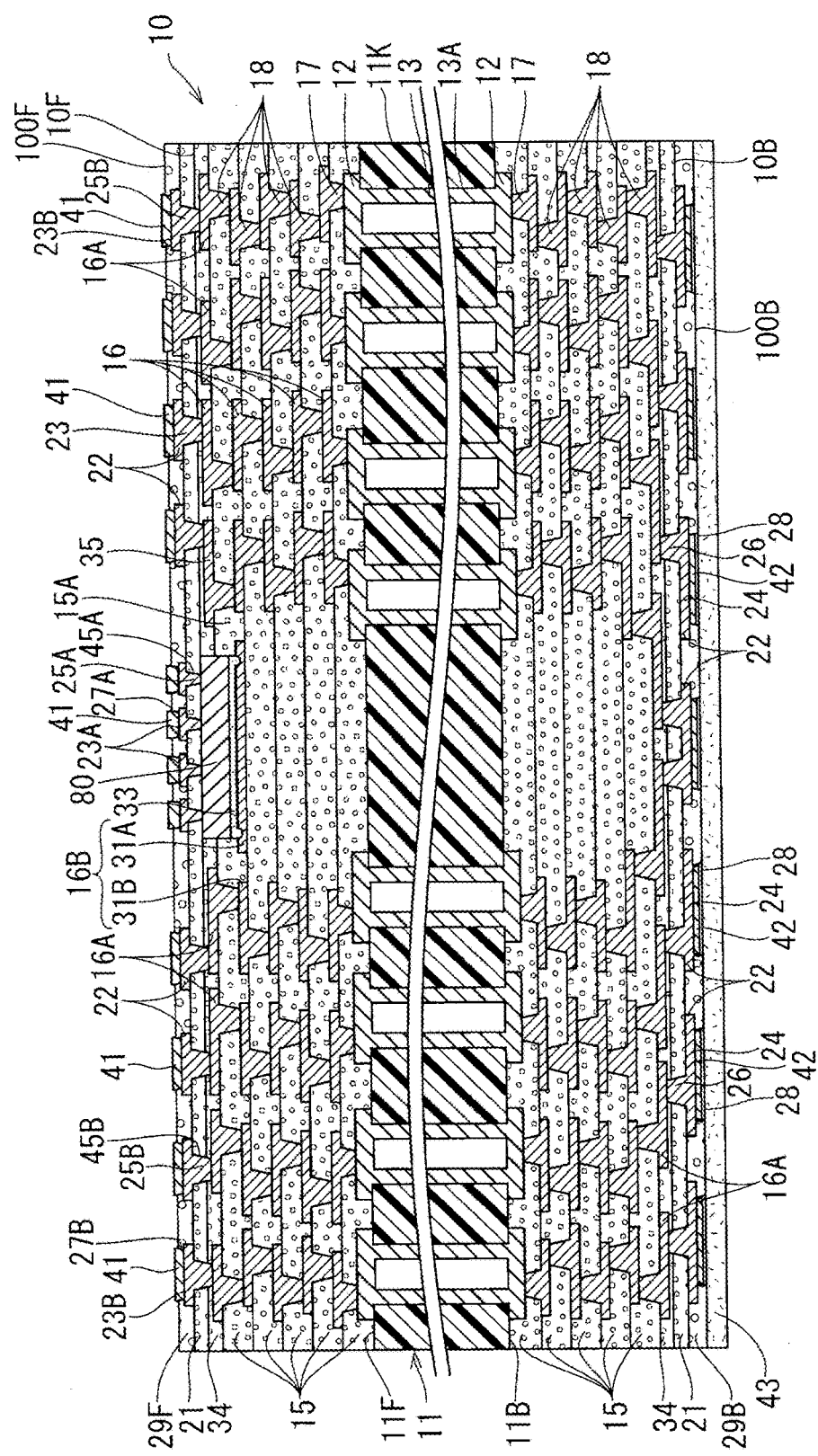
FIG. 15 illustrates a manufacturing process of the wiring substrate.

(8) As illustrated in FIG. 15, the resin protective layer 43 on the F surface (10F) side of the wiring board 10 with the cavity is removed, and the first solder resist layer (29B) on the B surface (10B) side of the wiring board 10 with the cavity is covered by a resin protective film 43. Then, similar to the process of FIG. 14, the F surface (10F) side of the wiring board 10 with the cavity is subjected to an electroless plating treatment, the second plating layers 41 are respectively formed on the second small-diameter conductor pads (23A) and the second large-diameter conductor pads (23B). In doing so, the first plating layer 42 is protected by the resin protective film 43.

(9) The resin protective layer 43 that covers the first solder resist layer (29B) on the B surface (10B) side of the wiring board 10 is removed, and the wiring board 100 with the built-in electronic component illustrated in FIG. 1 is completed.

The description about the structure and the manufacturing method of the wiring substrate 100 of the present embodiment is as given above. Next, an operation effect of the wiring substrate 100 is described.

According to the wiring substrate 100 of the present embodiment, the second plating layers 41 that are respectively formed on the second conductor pads 23 each protrude in a bump-like shape from the outer surface of the second solder resist layer (29F). Therefore, when the surface on the second solder resist layer (29F) is used as a mounting surface of the electronic components (90, 91) including a semiconductor element and the like, there is no need to form solder bumps as in a conventional wiring substrate, and improvement in yield can be achieved. Further, the first plating layers 42 are each recessed from the outer surface of the first solder resist layer (29B). Therefore, by overlaying the wiring substrate 100 with the surface on the first solder resist layer (29B) side facing downward on a circuit substrate having solder bumps on an upper surface thereof, the wiring substrate 100 can be mounted on the circuit substrate.

Further, in the wiring substrate 100, both the first plating layers 42 and the second plating layers 41 are each formed by the electroless Ni/Pd/Au metal layers. Therefore, the first plating layers 42 and the second plating layers 41 can be formed by the same electroless plating treatment. Further, the second openings 27 (the second small-diameter openings (27A) and the second large-diameter openings (27B)) each have an opening diameter smaller than that of the first openings 28. Therefore, a time period it takes for the second plating layers 41 to protrude to the outer side of the second solder resist layer (29F) can be shortened, and it becomes easy for the first plating layers 42 to be recessed with respect to the outer surface of the first solder resist layer (29B).

Further, in the wiring substrate 100 of the present embodiment, the second plating layers 41 are arranged in the electronic component mounting regions (R1, R2) of the F surface (100F). Therefore, due to the second plating layers 41, the electronic components (90, 91) can be connected to conductor circuit layers in the wiring substrate 100. In addition, the wiring substrate 100 has the built-in interposer 80 the electrically connects the electronic components (90, 91). Therefore, by narrowing spacing between the electronic components (90, 91), an electronic circuit apparatus in which the electronic components (90, 91) are mounted on the wiring substrate 100 can be made compact.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

(1) In the above embodiment, the wiring substrate 100 is a wiring substrate with a built-in electronic component. However, as long as the wiring substrate 100 has a structure that has openings that expose portions of conductor layers on both front and back surfaces as conductor pads, it is also possible that the wiring substrate 100 is a wiring substrate that does not have a built-in electronic component.

(2) In the above embodiment, the wiring substrate 100 may also be a coreless substrate that does not have the core substrate 11.

Figure 16:
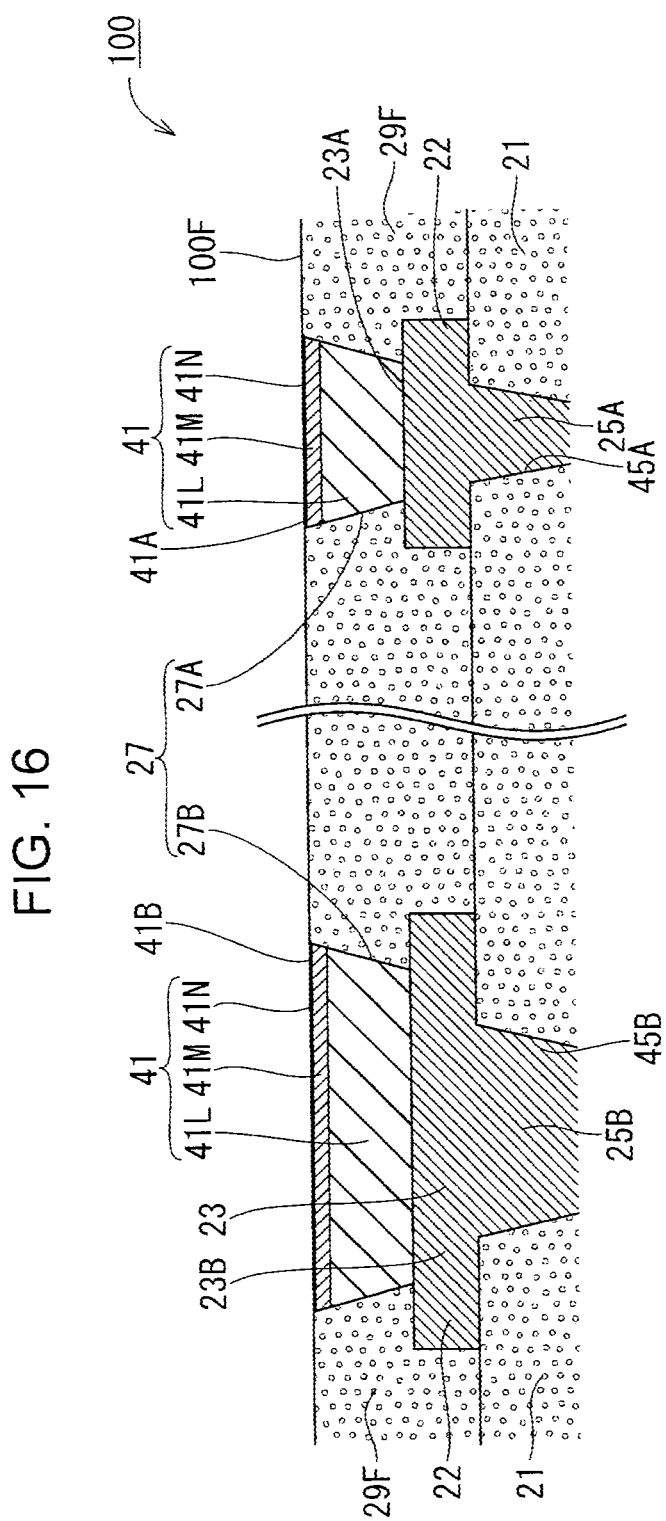
FIG. 16 is a cross-sectional view of a second plating layer of a wiring substrate according to a modified embodiment.

(3) As illustrated in FIG. 16, it is also possible that the second plating layers 41 are flush with the outer surface of the second solder resist layer (29F).

(4) In the above embodiment, in the second plating layers 41, two kinds of the second plating layers 41 (the second small-diameter plating layer (41A) and the second large-diameter plating layer (41B)) having different sizes (diameters) are provided. However, it is also possible that only one kind of the second plating layers 41 is provided, or three or more kinds of the second plating layers 41 having different sizes are provided.

(5) In the above embodiment, it is also possible that the second small-diameter openings (27A) and the second large-diameter openings (27B) have the same size. Further, it is also possible that the second openings 27 (the second small-diameter openings (27A) and the second large-diameter openings (27B)) and the first openings 28 have the same size.

In a wiring substrate, there may be a problem that the formation of the solder bump requires time and effort, causing reduction in yield.

A wiring substrate according to an embodiment of the present invention allows yield to be increased, and another embodiment of the present invention is a method for manufacturing such a wiring substrate.

A wiring substrate according to an embodiment of the present invention includes: a first insulating layer that forms one of a front surface and a back surface; a first conductor layer of which an outer side is covered by the first insulating layer; first openings that are formed in the first insulating layer and each expose a portion of the first conductor layer as a first conductor pad; a second insulating layer that forms the other one of the front surface and the back surface; a second conductor layer of which an outer side is covered by the second insulating layer; and second openings that are formed in the second insulating layer and each expose a portion of the second conductor layer as a second conductor pad. A first plating layer that is recessed with respect to an outer surface of the first insulating layer is formed on the first conductor pad, and a second plating layer that is flush with an outer surface of the second insulating layer or protrudes in a bump-like shape from the outer surface of the second insulating layer is formed on the second conductor pad.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising: a first outermost conductor layer;
   a first outermost insulating layer formed on the first outermost conductor layer such that the first outermost insulating layer is covering the first outermost conductor layer;
   a second outermost conductor layer formed on an opposite side of the first outermost conductor layer; a second outermost insulating layer formed on the second outermost conductor layer such that the second outermost insulating layer is covering the second outermost conductor layer; and a built-in interposer device configured to connect a plurality of electronic components to be mounted in an electronic component mounting region of the second outermost insulating layer, wherein the first outermost insulating layer has a plurality of first openings such that the plurality of first openings is exposing a plurality of first conductor pads comprising a plurality of portions of the first outermost conductor layer, respectively, the second outermost insulating layer has a plurality of second openings such that the plurality of second openings is exposing a plurality of second conductor pads comprising a plurality of portions of the second outermost conductor layer, respectively, each of the first conductor pads has a first plating layer formed in a respective one of the first openings such that the first plating layer is recessed with respect to an outer surface of the first outermost insulating layer, each of the second conductor pads has a second plating layer formed in a respective one of the second openings such that the second plating layer is formed flush with an outer surface of the second outermost insulating layer or has a bump shape protruding from the outer surface of the second outermost insulating layer, and the plurality of second conductor pads includes a plurality of the second conductor pads positioned to connect the electronic components through the built-in interposer device and a plurality of the second conductor pads positioned to connect one of the electronic components.

2. A wiring substrate according to claim 1, wherein the first outermost insulating layer comprises a solder resist layer, and the second outermost insulating layer comprises a solder resist layer.

3. A wiring substrate according to claim 1, wherein each of the second conductor pads has the second plating layer having the bump shape protruding from the outer surface of the second outermost insulating layer such that a plurality of second plating layers has substantially a same protruding height.

4. A wiring substrate according to claim 3, wherein each of the second conductor pads has the second plating layer such that the plurality of second plating layers has protruding heights which are 15 μm or less.

5. A wiring substrate according to claim 3, wherein each of the second conductor pads has the second plating layer such that the second plating layer has a diameter which is greater than a diameter of a respective one of the second openings.

6. A wiring substrate according to claim 1, wherein the first plating layer comprises an electroless Ni/Pd/Au metal layer comprising a Ni layer, a Pd layer and a Au layer, and the second plating layer comprises an electroless Ni/Pd/Au metal layer comprising a Ni layer, a Pd layer and a Au layer.

7. A wiring substrate according to claim 6, wherein the first plating layer comprises the electroless Ni/Pd/Au metal layer such that the Ni layer has a thickness in a range of from 3 μm to 10 μm, the Pd layer has a thickness in a range of from 0 μm to 1 μm, and the Au layer has a thickness in a range of from 0.03 μm to 0.1 μm, and the second plating layer comprises the electroless Ni/Pd/Au metal layer such that the Ni layer has a thickness in a range of from 10 μm to 35 μm, the Pd layer has a thickness in a range of from 0.1 μm to 1 μm, and the Au layer has a thickness in a range of from 0.03 μm to 0.1 μm.

8. A wiring substrate according to claim 1, wherein the plurality of second openings has a diameter which is smaller than a diameter of the plurality of first openings.

9. A wiring substrate according to claim 1, wherein the second outermost insulating layer has the electronic component mounting region formed to mount the plurality of electronic components including a semiconductor component such that the second plating layer is formed on each of the second conductor pads formed in the electronic component mounting region of the second outermost insulating layer.

10. A wiring substrate according to claim 9, wherein the electronic component mounting region comprises a plurality of regions formed to mount the plurality of electronic components, respectively.

11. A wiring substrate according to claim 9, wherein the second outermost insulating layer is formed such that the second outermost insulating layer is covering the built-in interposer device.

12. A wiring substrate according to claim 2, wherein each of the second conductor pads has the second plating layer having the bump shape protruding from the outer surface of the second outermost insulating layer such that a plurality of second plating layers has substantially a same protruding height.

13. A wiring substrate according to claim 12, wherein each of the second conductor pads has the second plating layer such that the plurality of second plating layers has protruding heights which are 15 μm or less.

14. A wiring substrate according to claim 12, wherein each of the second conductor pads has the second plating layer such that the second plating layer has a diameter which is greater than a diameter of a respective one of the second openings.

15. A wiring substrate according to claim 2, wherein the first plating layer comprises an electroless Ni/Pd/Au metal layer comprising a Ni layer, a Pd layer and a Au layer, and the second plating layer comprises an electroless Ni/Pd/Au metal layer comprising a Ni layer, a Pd layer and a Au layer.

16. A wiring substrate according to claim 2, wherein the plurality of second openings has a diameter which is smaller than a diameter of the plurality of first openings.

17. A method for manufacturing a wiring substrate, comprising: forming a first outermost insulating layer on a first outermost conductor layer such that the first outermost insulating layer covers the first outermost conductor layer;

forming a second outermost insulating layer on a built-in interposer device and a second outermost conductor layer on an opposite side of the first outermost conductor layer such that the second outermost insulating layer covers the built-in interposer device and the second outermost conductor layer;

forming a plurality of first openings in the first outermost insulating layer such that the plurality of first openings exposes a plurality of first conductor pads comprising a plurality of portions of the first outermost conductor layer, respectively;

forming a plurality of second openings in the second outermost insulating layer such that the plurality of second openings exposes a plurality of second conductor pads comprising a plurality of portions of the second outermost conductor layer, respectively;

forming a first plating layer on each of the first conductor pads in a respective one of the first openings such that the first plating layer is recessed with respect to an outer surface of the first outermost insulating layer; and forming a second plating layer on each of the second conductor pads in a respective one of the second openings such that the second plating layer is formed flush with an outer surface of the second outermost insulating layer or has a bump shape protruding from the outer surface of the second outermost insulating layer, wherein the built-in interposer device is configured to connect a plurality of electronic components to be mounted in an electronic component mounting region of the second outermost insulating layer, the plurality of second conductor pads includes a plurality of the second conductor pads positioned to connect the electronic components through the built-in interposer device and a plurality of the second conductor pads positioned to connect one of the electronic components.

18. A method for manufacturing a wiring substrate according to claim 17, wherein the forming of the first plating layer comprises applying an electroless plating on the first conductor pads, and the forming of the second plating layer comprises applying an electroless plating on the second conductor pads.

19. A method for manufacturing a wiring substrate according to claim 18, wherein the forming of the first plating layer comprises applying an electroless plating on the first conductor pads, and the forming of the second plating layer comprises applying an electroless plating on the second conductor pads on the opposite side of the first outermost conductor layer.

20. A method for manufacturing a wiring substrate according to claim 19, further comprising:

forming a protective layer on one of the first outermost insulating layer and the second outermost insulating layer such that the one of the first outermost insulating layer and the second outermost insulating layer is protected from the electroless plating of the other one of the first outermost insulating layer and the second outermost insulating layer.

* * * * *